(12) United States Patent
Nagata et al.

(10) Patent No.: US 6,557,957 B2
(45) Date of Patent: May 6, 2003

(54) SHIELD CASE FOR ELECTRONIC EQUIPMENT

(75) Inventors: Futoshi Nagata, Kanagawa (JP); Koji Otani, Kanagawa (JP)

(73) Assignee: Mitsumi Electric Co., LTD, Tokyo (JP)

( * ) Notice: Subject to any disclaimer, the term of this patent is extended or adjusted under 35 U.S.C. 154(b) by 0 days.

(21) Appl. No.: 09/817,400

(22) Filed: Mar. 27, 2001

(65) Prior Publication Data

US 2001/0026116 A1 Oct. 4, 2001

(30) Foreign Application Priority Data

Mar. 31, 2000 (JP) .......................................... 2000-096769

(51) Int. Cl.[7] .............................................. A47B 47/00
(52) U.S. Cl. ...................... 312/223.1; 220/83; 312/263; 312/257.1
(58) Field of Search ..................... 220/76, 83; 361/683, 361/684, 735, 832, 829, 685; 312/257.1, 263, 265.5, 223.1, 223.2, 330

(56) References Cited

U.S. PATENT DOCUMENTS

| | | | |
|---|---|---|---|
| 4,560,079 A | * | 12/1985 | Eddleston et al. ......... 220/76 X |
| 5,398,157 A | * | 3/1995 | Paul ........................... 361/684 |
| 5,600,538 A | * | 2/1997 | Xanthopoulos ............. 361/683 |
| 5,796,585 A | * | 8/1998 | Sugiyama et al. ... 312/223.2 X |

* cited by examiner

Primary Examiner—John G. Weiss
Assistant Examiner—Michael J. Fisher
(74) Attorney, Agent, or Firm—Whitham, Curtis, and Christofferson, P.C.

(57) ABSTRACT

In a shield case for housing an electronic equipment therein, a plurality of metal plates include a top plate, a bottom plate, a front plate, a rear plate, a pair of side plates, which are assembled to one another in a box-like shape. A projection is formed on an outer face of the rear plate. A stopper projection is formed on an outer face of each side plate. A rear face holding piece extends downwardly from a rear edge of the top plate. The rear face holding piece is formed with a holding member at a lower end portion thereof. The holding member elastically abuts on the outer face of the rear plate, after climbing over the projection. Side face holding pieces extend downwardly from side edges of the top plate. Each side face holding piece is formed with a notched portion at a lower end portion thereof. The notched portion includes a guide groove for receiving the stopper projection in accordance with the rearward movement of the top plate when the holding member climbs over the projection, and an engagement groove extending forward from an upper end of the guide groove, for engaging with the stopper projection in accordance with the forward movement of the top plate when the holding member abuts on the outer face of the rear plate after climbing over the projection.

16 Claims, 3 Drawing Sheets

SHIELD CASE FOR ELECTRONIC EQUIPMENT

BACKGROUND OF THE INVENTION

The present invention relates to a shield case for an electronic equipment, such as a receiver, an electronic tuner, and amplifier and so on, which is composed of a plurality of thin metal plates assembled to one another in a box-like shape, having an interior in which circuit boards carrying thereon electronic elements, integrated circuit elements, etc., electronic components and so on are contained.

Generally, in the electronic equipment such as the receiver, the electronic tuner, the amplifier and so on, the circuit boards carrying thereon the electronic elements, the integrated circuit elements, etc., the electronic components and so on are contained in a shield case which is constructed by assembling thin metal plates. The electronic equipment is so constructed that influences of electromagnetic wave noises from outside and occurring inside may be restrained, and mechanical protection can be obtained by the shield case.

As shown in FIG. 5, a related shield case 100 is composed of constituent plates such as a front plate 101, side plates 102, a top plate 104, and a bottom plate (not shown) which are assembled to one another into a box-like shape. In the related shield case 100, the top plate 104 is assembled, after the circuit boards, the electronic components and so on have been received in a state where the top plate 104 is open.

Each of the side plates 102 is integrally provided with a stopper projection 105 by a stamping process or the like at a position adjacent to an upper edge of its outer face in a projecting manner. Similarly, the rear plate 103 is integrally provided with a click projection 106 in a semispherical shape at a position adjacent to an upper edge of its outer face in a projecting manner.

The top plate 104 is integrally provided with side face holding pieces 107 and a rear face holding piece 108 which are respectively bent downward substantially at the right angle along both side edges and a rear face side edge thereof. Each of the side face holding pieces 107 is divided into a plurality of strips by a plurality of slits 109 which open at its lower end edge. As shown in FIG. 6, a lower end portion of the side face holding piece 107 is bent inwardly in a substantially V-shape to form a holding projection 110.

As shown in FIG. 5, the side face holding piece 107 is provided with a guide groove 111 which opens wide in a vertical direction at a position corresponding to the stopper projection 105 of the side plate 102. An open edge 112 at a forward side of the guide groove 111 consists of a slanted edge portion 112a whose open width becomes gradually larger toward the forward side and a vertical edge portion 112b continuing from the slanted edge portion 112a.

The rear face holding piece 108 is also divided into a plurality of strips by a plurality of slits which open at its lower end edge, although not shown in the drawing, and as shown in FIG. 5, a lower end portion of the rear face holding piece 108 is bent inwardly in a substantially V-shape to form a holding projection 113.

The top plate 104 which has been constructed as described above is assembled to the side plates 102 and the rear plate 103 so as to cover these plates. The holding projection 113 of the rear face holding piece 108 is adapted to climb over the click projection 106 and elastically contact with an outer face of the rear plate 103 thereby to lock the top plate 104. Moreover, when the holding projection 113 of the rear face holding piece 108 climbs over the click projection 106, the entire top plate 104 moves backward to bring the stopper projection 105 into alignment with the guide groove 111 and allows the stopper projection 105 to enter into the guide groove 111. After the holding projection 113 has climbed over the click projection 106, the entire top plate 104 moves forward thereby to bring the stopper projection 105 into contact with the vertical edge portion 112b of the guide groove 111.

The holding projections 110 of the side face holding pieces 107 and the holding projection 113 of the side face holding piece 108 are respectively assembled to the outer faces of the side plates 102 and the rear plate 103 in elastic contact. By locking the holding projection 113 of the rear face holding piece 108 with the click projection 106, the top plate 104 is retained. The top plate 104 is so constructed as to be retained even in such a shield case as having no holding piece at its forward side, because the stopper projection 105 is abutted against the vertical edge portion 112b of the guide groove 111 of the side face holding piece 107 by elastic force of the rear face holding piece 108.

Accordingly, the shield case 100 is so constructed that the constituent members can be assembled to one another by an extremely simple way without employing any fastening means such as screws, welding, deposition, etc. Thus, influence of electromagnetic wave noise can be restrained and mechanical protection for the circuit boards and the electronic components contained therein can be obtained by the shield case 100.

As described, in the related shield case 100 which cannot be provided with a holding piece at its forward side, the stopper projection 105 is abutted against the vertical edge portion 112b of the guide groove 111 of the side face holding piece 107, and the rear face holding piece 108 is locked by the click projection 106 under the elastic forces of the side face holding pieces 107 and the rear face holding piece 108, thereby maintaining the top plate 104 in the assembled state to the side plates 102 and the rear plate 103. The related shield case 100 has such a characteristic that it is flexible in a direction of its thickness, since the holding pieces are provided only at the rear face and the side faces of the top plate 104, and the shield case 100 is formed of thin metal plates.

Therefore, in the case where the shield case 100 has been subjected to a serious impact such as falling down, or a pressure has been applied to the top plate 104, a phenomenon of deformation or flexure occurs in the top plate 104 or the other constituent members in a direction of their thickness. This will force the side face holding pieces 107 and the rear face holding piece 108 to be opened outward, and holding forces for the side plates 102 and the rear plate 103 will be lost. As a result, there may arise a problem that the top plate 104 is disengaged or displaced, and a reliable shield performance cannot be obtained.

It has been considered that the constituent members may be formed of thick metal plates, for example. However, this will lead to a problem that an overall cost will be increased because cost for material, changes in manufacturing steps of the components and in control steps, etc. are required. There will be a further problem that the shield case 100 may become larger in size and heavier in weight by employing such a countermeasure.

SUMMARY OF THE INVENTION

In view of the above, it is therefore an object of the present invention to provide a shield case for an electronic equipment in which the top plate is prevented from being detached, even in the case where an impact has been applied, and the shielding performance can be reliably maintained.

In order to achieve the above object, according to the invention, there is provided a shield case for housing an electronic equipment therein, comprising:

a plurality of metal plates including a top plate, a bottom plate, a front plate, a rear plate, a pair of side plates, which are assembled to one another in a box-like shape;

a projection, formed on an outer face of the rear plate;

a stopper projection, formed on an outer face of each side plate;

a rear face holding piece, downwardly extending from a rear edge of the top plate, the rear face holding piece formed with a holding member at a lower end portion thereof, the holding member elastically abutting on the outer face of the rear plate, after climbing over the projection; and side face holding pieces, downwardly extending from side edges of the top plate, each side face holding piece formed with a notched portion at a lower end portion thereof, the notched portion including:

a guide groove for receiving the stopper projection and moving the top plate forward while the holding member climbs over the projection, and an engagement groove extending forward from an upper end of the guide groove, for engaging with the stopper projection in accordance with the rearward movement of the top plate when the holding member abuts on the outer face of the rear plate after climbing over the projection.

Here, a width of the engagement groove is wider than a vertical width of the stopper projection, and a length of the engagement groove is shorter than a horizontal width of the stopper projection. A distance between a front end of the engagement groove and the rear face holding piece is longer than a distance between a rear edge of the side plate and a front end of the stopper projection.

In this configuration, the top plate assembled to the side plates and the rear plate is retained at its backward side by locking the rear face holding piece by the projection, and at the same time, retained at its side parts by the stopper projections engaged in the engagement grooves to lock the side face holding pieces. Accordingly, even though flexure or the like may occur in the top plate by an impact of dropping, etc. or a pressure is applied to the shield case, the stopper projections are retained in the engagement grooves. Therefore, a dropout of the top plate can be reliably prevented, because elastic forces of the side face holding pieces and the rear face holding piece are effectively exerted on the side plates and the rear plate.

DETAILED DESCRIPTION OF THE PREFERRED EMBODIMENTS

Figure 1:
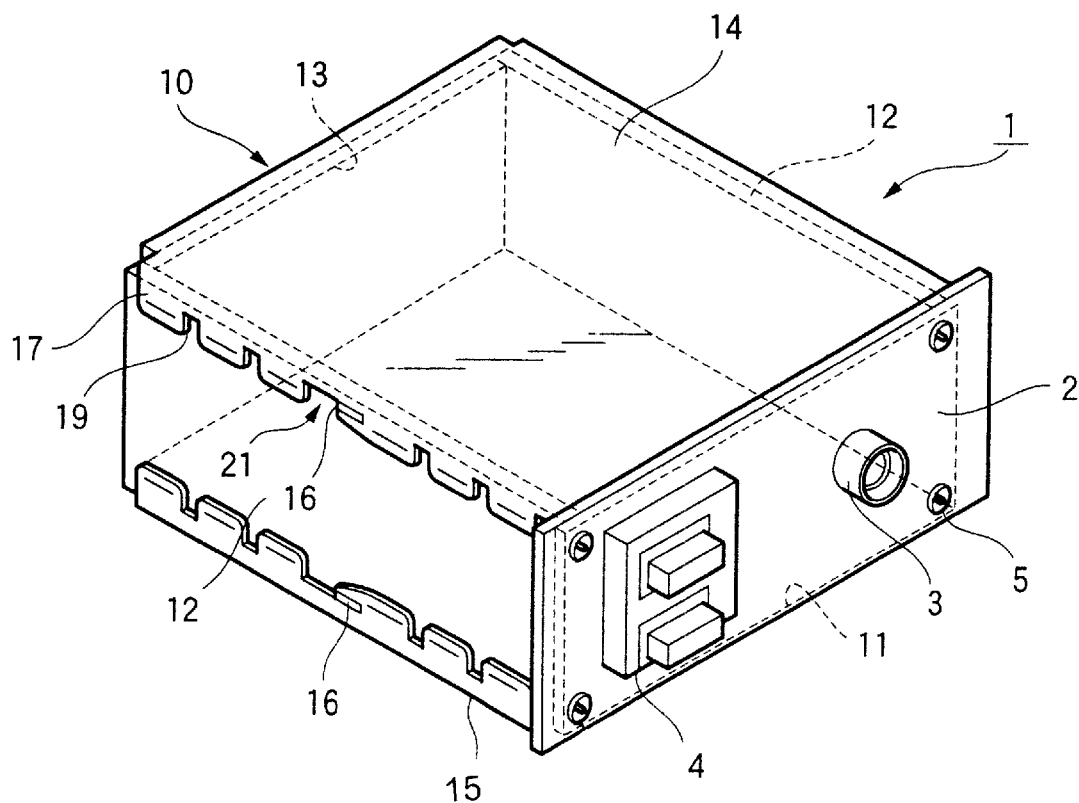
FIG. 1 is a perspective view of a shield case according to one embodiment of the invention.

Now, one preferred embodiment of the invention will be described in detail referring to the accompanying drawings. A shield case 10 illustrated as an example is applied to a receiver 1 having a front plate 11 which is provided with a coaxial connector 3 for inputting high frequency signals and a feeder terminal connector 4 for outputting the high frequency signals as shown in FIG. 1. Although not described here in detail, the receiver 1 includes circuit boards carrying thereon electronic elements and integrated circuit elements, etc. which constitute a receiving circuit, a control circuit, etc. or electronic components and so on contained in the shield case 10. The receiver 1 is constructed by fixing a front plate 11 of the shield case 10 to a C-shaped case consisting of a rear plate and side plates by caulking or the like.

The shield case 10 is constructed in a box-like shape by assembling the front plate 11, left and right side plates 12, a rear plate 13, a top plate 14, and a bottom plate 15 which have been respectively formed of thin metal plates to one another. Because the left and right side plates 12 are equivalently formed members, only one of them will be described as a representative of the structure. The bottom plate 15 has a coupling structure with respect to the side plates 12 and the rear plate 13 which is equivalent to that of the top plate 14, and therefore, a detailed description of the bottom plate 15 will be omitted.

It is apparent that the above described constituent members of the shield case 10 are not only formed independently, but an integral member consisting of the left and right side plates 12 and the bottom plate 15 formed in a substantially C-shape, or an integral member consisting of these plates and the rear plate 13 may be employed. In the shield case 10, although not shown in the drawings, the side plate 12 may be provided with an opening through a pin connector mounted on a circuit board to perform a connection with a CPU is exposed outward, or the top plate 14 and the rear plate 13 may be formed with a plurality of undulated ribs for reinforcement.

The side plate 12 is in a laterally elongated rectangular shape as a whole, and integrally provided with a plurality of caulking pieces at its front end edge and its back end edge respectively although not shown in the drawings. Each of the caulking pieces is constructed by bending a strip-like projection respectively projected from the front end edge and the back end edge inwardly substantially at the right side. The side plates 12 are assembled to the front plate 11 and the rear plate 13 by caulking these pieces into corresponding caulking hole to construct a rectangular framework as a whole. It is apparent that the front plate 11 and the rear plate 13 may be provided with the caulking pieces, while the side plates 12 may be provided with the caulking holes, or appropriate other coupling structures may be employed to assemble the shield case 10. A decorative face plate 2 is preferably joined to the front of front plate 11.

Figure 4:
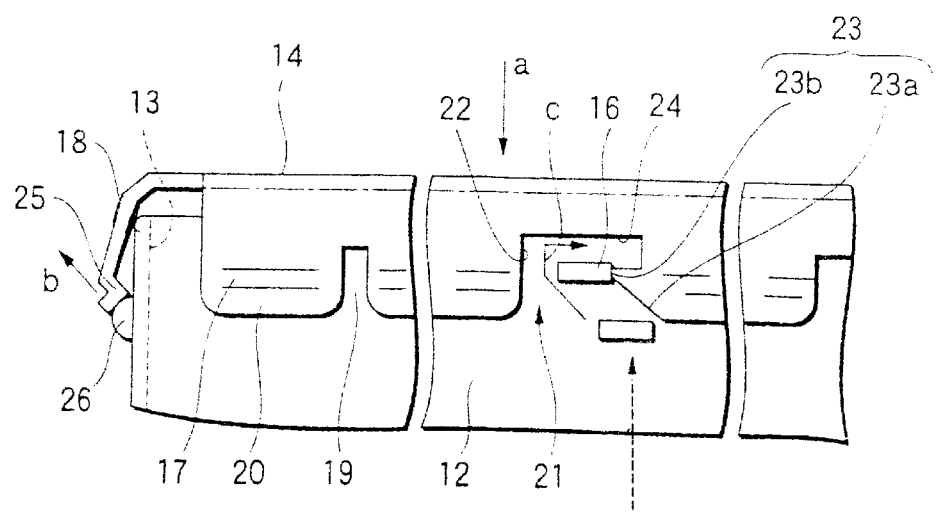
FIG. 4 is an explanatory view of assembling work of the top plate to the side plate.
Figure 5:
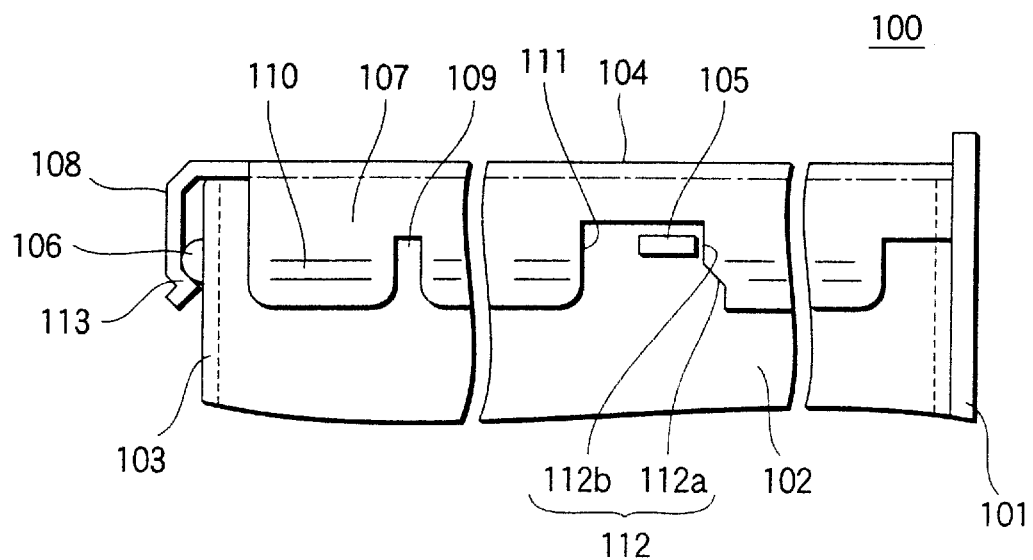
FIG. 5 is a side view of an essential part of a related shield case.
Figure 6:
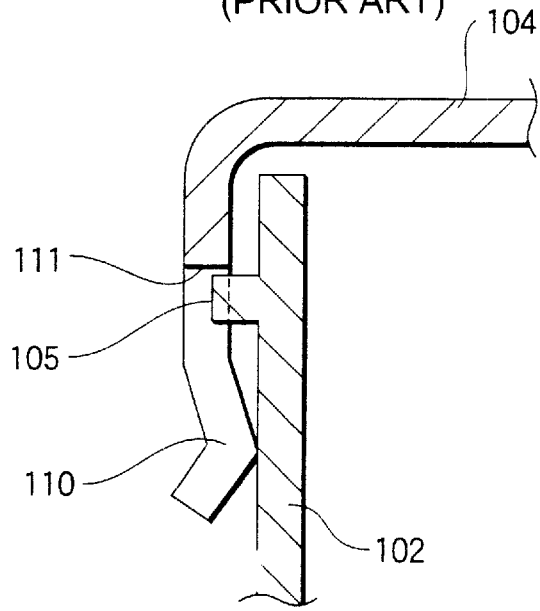
FIG. 6 is an exploded perspective view of the essential part for explaining a structure of a side plate and a top plate composing the related shield case.

The top plate 14 has an outer profile which is larger than the framework constructed by assembling the aforesaid plate 11, the rear plate 13 and the side plates 12. The top plate 14 is integrally provided with side face holding pieces 17 and a rear face holding piece 18 at both side edges and a back edge respectively as shown in FIG. 4. The side face holding pieces 17 and the rear face holding piece 18 or other parts of the top plate 14, which will be described below, are formed at the same time when a plate of metal material is subjected to a stamping process.

Figure 3:
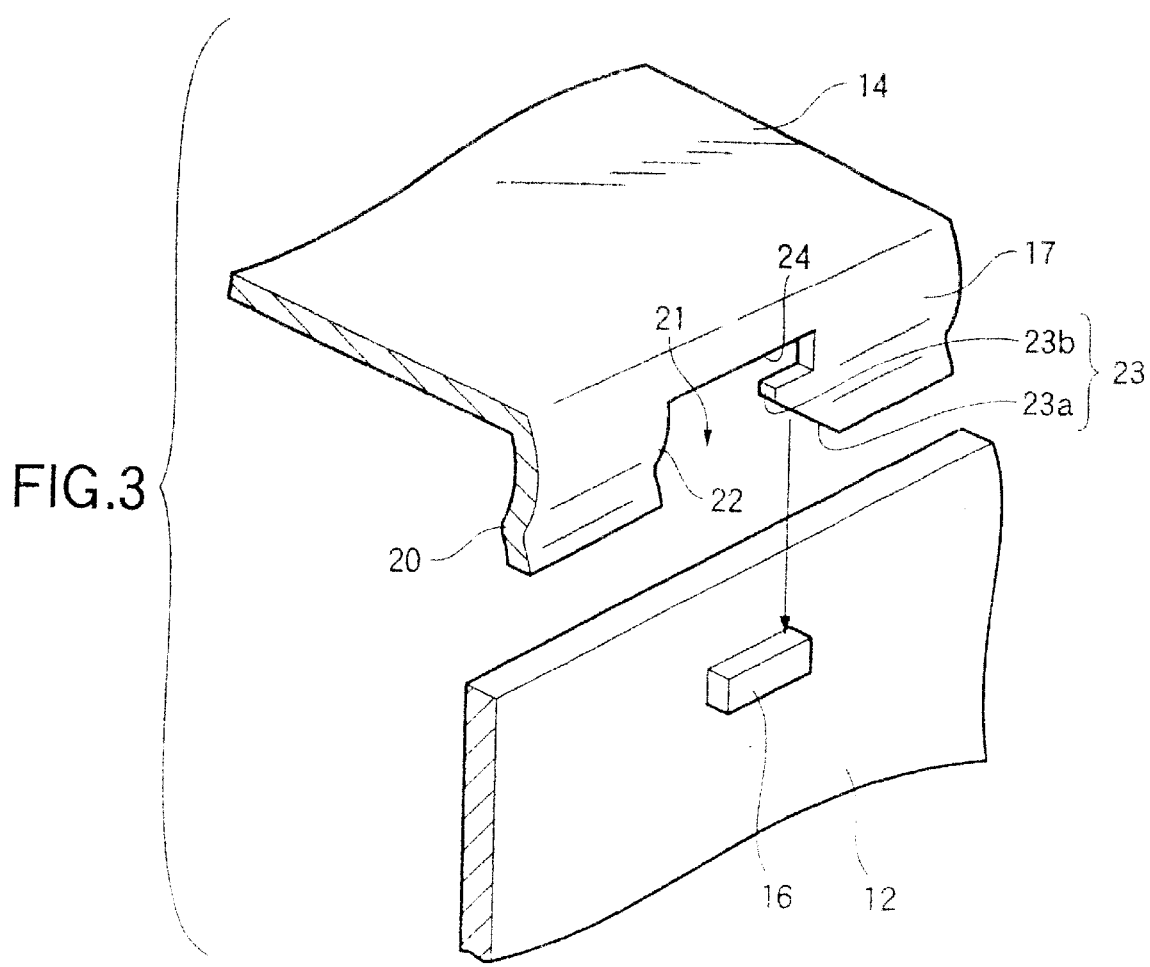
FIG. 3 is an exploded perspective view of the essential part for explaining a structure of a side plate and a top plate composing the shield case.

The side face holding pieces 17 are formed by bending inwardly substantially at the right angle, flange-like projections projected from both side edges of the top plate 14 along the substantially entire edges, and the side face holding pieces 17 are divided into a plurality of strip-like areas by forming a plurality of slits 19 which open at their lower end edges. By dividing the side face holding pieces 17 into the strip-like areas, the side face holding pieces 17 are rendered elastically deformable in a direction of their thickness. As shown in detail in FIG. 3, the side face holding pieces 17 are bent inwardly in a substantially V-shape to form holding projections 20. A distance between the opposed holding projections 20 of the left and right side face holding pieces 17 is narrower than a distance between the opposed left and right side plates 12.

Each of the side face holding piece 17 is provided with a guide groove 21 in a vertical direction which opens at its lower end edge corresponding to the stopper projection 16 of the side plate 12. The guide groove 21 has an open width of a size enough to receive the stopper projection 16. An open edge 22 at the backward side is formed as a vertical wall and an open edge of the forward side consists of a slanted edge portion 23a which becomes larger toward the forward side and a vertical edge portion 23b which continues from the slanted edge portion 23a. The guide groove 21 is formed in the side face holding piece 17 in such a manner that a distance between a below mentioned rear face holding piece 18 and the vertical edge portion 23b of one of the open edges 23 is larger than a distance between a back end edge of the side plate 12 and a forward side edge of the stopper projection 16.

An engagement groove 24 is formed in the guide groove 21 by horizontally cutting in the vertical edge portion 23b of the one open edge 23 in a forward direction. A width of the engagement groove 24 is larger than a width of the stopper projection 16, and a length of the engagement groove 24 is shorter than a length of the stopper projection 16. A vertical distance of the engagement groove 24 from a main face of the top plate 14 is substantially the same as a vertical distance of the stopper projection 16 from the upper edge of the side plate 12. The engagement groove 24 is formed in the one open edge 23 having a distance between its front end edge and the rear face holding piece 18 which is larger than the distance between the back end edge of the side plate 12 and the forward side edge of the stopper projection 16.

Figure 2:
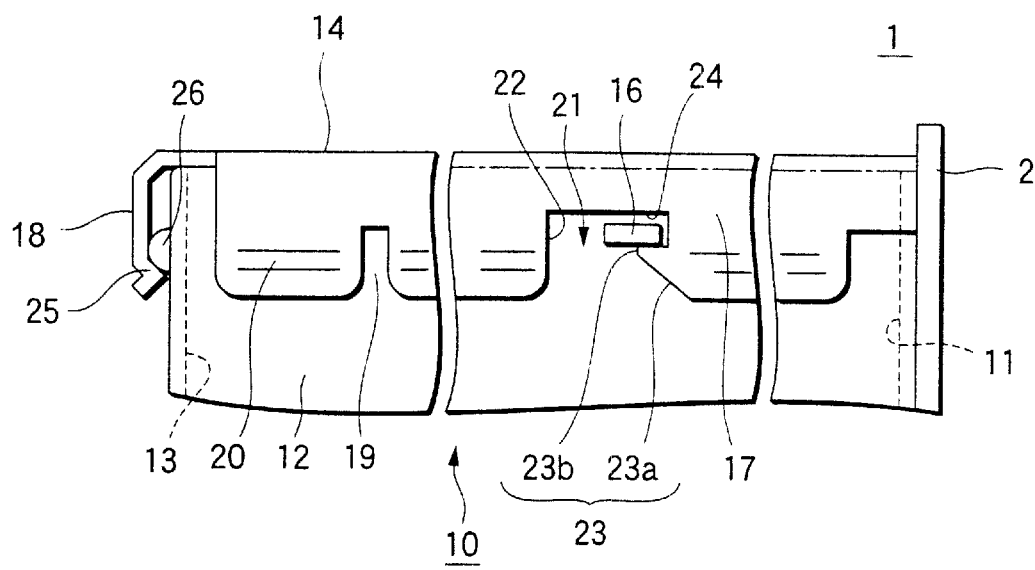
FIG. 2 is a side view of an essential part of the shield case.

The rear face holding piece 18 is also formed by bending inwardly substantially at the right angle, a flange-like projection projected from a back end edge of the top plate 14 along the substantially entire edge, and divided into a plurality of strip-like areas by forming a plurality of slits which open at the lower end edge, although not shown in the drawings. By dividing the rear face holding piece 18 into the strip-like areas, the rear face holding piece 18 is rendered elastically deformable in a direction of its thickness. As shown in FIG. 2, the rear face holding piece 18 is bent inwardly in a substantially V-shape to form a holding projection 25. The rear face holding piece 18 is formed in such a manner that a distance between the holding projection 25 and a front end edge of the top plate 14 is smaller than a length of the side plate 12.

The rear plate 13 is provided with click projections 26 on its outer face. The click projections 26 are formed by stamping at the same time when a plate of metal material is subjected to a stamping process to form the rear plate 13. The click projections 26 are in a semispherical shape as shown in FIG. 2, and a pair of the click projections 26 are formed along upper and lower edges of the rear plate 13 (the lower one is omitted in the drawings) respectively apart from each other in a direction of a width of the rear plate.

A vertical distance of the click projection 26 from the upper edge of the rear plate 13 is smaller than a vertical distance of the holding projection 25 of the rear face holding piece 18 from the top plate 14. It is apparent that the structure of the click projection 26 need not be limited to such structure, but the click projection 26 may be formed in a wedge-like shape in cross section having a gradually increased projecting amount toward its upper edge part (or lower edge part) in a vertical direction.

The top plate 14 which has been constructed as described above is assembled to the side plates 12 and the rear plate 13 which have been assembled beforehand, so as to cover them from above as shown by an arrow a in FIG. 4. The holding projection 25 of the rear face holding piece 18 is elastically deformed outward as shown by an arrow b in FIG. 4 and climbs over the click projection 26. The top plate 14 is prevented from being disengaged, since the holding projection 25 of the rear face holding piece 18 is brought in elastic contact with the outer face of the rear plate 13 and locked by the click projection 26.

The entire top plate 14 moves forward through use of the slanted edge portion 23a and elastic force generated when the holding projection 25 of the rear face holding piece 18 climbs over the click projection 26. Thereby, the top plate 14 allows the stopper projection 16 to face with an opening of the guide groove 21 and to enter into the guide groove 21 along the slanted edge portion 23a.

As the top plate 14 is pushed in, the side edge of the stopper projection 16 is displaced from the slanted edge portion 23a to the vertical edge portion 23b along the one open edge 23 of the guide groove 21. After the holding projection 25 of the rear face holding piece 18 has climbed over the click projection 26, the stopper projection 16 is brought to a position facing the engagement groove 24. When the elastic force of the rear face holding piece 18 is decreased in this state and the top plate 14 is displaced backward, the stopper projection 16 comes in engagement with the engagement groove 24 as shown in FIG. 2. Accordingly, the stopper projection 16 is displaced as shown by an arrow c in FIG. 4.

The top plate 14 is assembled to the side plates 12 and the rear plate 13 by elastically abutting the holding projections 20 of the side face holding pieces 17 and the holding projection 25 of the rear face holding piece 18 against the outer faces of the side plates 12 and the rear plate 13 respectively. As described above, The top plate 14 is assembled to the side plates 12 and the rear plate 13 in a state where the holding projection 25 of the rear face holding piece 18 is locked by the click projection 26, and at the same time, the stopper projection 16 is engaged with the engagement groove 24.

The bottom plate 15 is assembled to the side plates 12 and the rear plate 13 in a similar manner, because its coupling structure with respect to the side plates 12 and the rear plate 13 is constructed in the same manner as that of the top plate 14 as described above.

Accordingly, even though a serious impact has been applied to the shield case 10 by dropping the receiver 1 by mistake, or a pressure has been applied to the top plate 14, the top plate 14 is prevented from moving against the elastic force of the side face holding pieces 17 and the rear face holding piece 18 because the stopper projections 16 are engaged with the engagement grooves 24. Therefore, disengaging phenomenon of the side plates 12 and the rear plate 13 from the top plate 14 is reliably prevented. With this structure of the shield case 10, shielding performance for restraining influence of electromagnetic wave noise can be attained, and mechanical protection for the circuit boards, the electronic components contained therein can be obtained.

Although the shield case 10 applied to the receiver 1 has been described in the above described embodiment, it is obvious that the invention can be applied to the shield cases for other electronic equipments.

What is claimed is:

1. A shield case for housing an electronic equipment therein, comprising:
   a plurality of metal plates including a top plate, a bottom plate, a front plate, a rear plate, a pair of side plates, which are assembled to one another in a box-like shape;
   a projection, formed on an outer face of the rear plate;
   a stopper projection, formed on an outer face of each side plate;
   a rear face holding piece, downwardly extending from a rear edge of the top plate, the rear face holding piece formed with a holding member at a lower end portion thereof, the holding member elastically abutting on the outer face of the rear plate, after climbing over the projection; and
   side face holding pieces, downwardly extending from side edges of the top plate, at least one side face holding piece formed with a notched portion at a lower end portion thereof, the notched portion including:
      guide groove for receiving the stopper projection having a slanted edge which defines a width thereof increasing toward a forward side, and
      an engagement groove extending forward from an upper end of at least one guide groove, for engaging with the stopper projection,
   wherein at least one of the top plate and the bottom plate is moved forward by a pushing force of the stopper projection with respect to the slanted edge when the stopper projection is guided in the guide groove along the slanted edge;
   wherein the rear face holding piece is elastically deformed outward in accordance with the forward movement of at least one of the top plate and the bottom plate; and
   wherein a reaction plate of the rear face holding piece deformed by the forward movement of at least one of the top plate and the bottom plate is released when the stopper projection is engaged with the engagement groove.

2. The shield case as set forth in claim 1, wherein a width of the engagement groove is wider than a vertical width of the stopper projection, and a length of the engagement groove is shorter than a horizontal width of the stopper projection; and
   wherein a distance between a front end of the engagement groove and the rear face holding piece is longer than or equal to a distance between a rear edge of the side plate and a front end of the stopper projection when the stopper projection is engaged with the engagement groove.

3. The shield case of claim 1 wherein said side face holding pieces are bent inwardly and form a holding projection on said lower end portion, wherein a distance between opposed holding projections on side face holding pieces located on a left and a right side of said top plate is narrower than a distance between said pair of side plates.

4. The shield case of claim 3 further comprising additional side face holding piece members extending downwardly from said top plate that are formed as strips where each strip is bent inwardly and form a holding projection on a lower end portion, wherein a distance between opposed holding projections on said additional side face holding pieces located on a left and a right side of said top plate is narrower than a distance between said pair of side plates.

5. The shield case of claim 1 wherein said side face holding pieces are elastically deformable in a direction of their thickness.

6. The shield case of claim 1 wherein said projection is hemispherical in shape.

7. The shield case as set forth in claim 1 wherein a width of the engagement groove is wider than a vertical width of the stopper projection and a length of the engagement groove is shorter than a horizontal width of the stopper projection, and wherein a distance between a front end of the engagement groove and the rear face holding piece is longer than or equal to a distance between a rear edge of a side plate and a front end of the stopper projection when the stopper projection is engaged with the engagement groove.

8. The shield case as set forth in claim 1, wherein a width of the engagement groove is wider than a vertical width of the stopper projection, and a length of the engagement groove is shorter than a horizontal width of the stopper projection; and
   wherein a distance between a front end of the engagement groove and the rear face holding piece is smaller than a distance between a rear edge of the side plate and a front end of the stopper projection when the stopper projection is not engaged with the engagement groove.

9. The shield case as set forth in claim 1, wherein a front end of the engagement groove and the rear face holding piece are elastically brought into contact with a rear edge of the side plate and a front end of the stopper projection, respectively.

10. A shield case for housing an electronic component therein, comprising:
    a plurality of plates including a top plate, a bottom plate, a front plate, a rear plate, and a pair of side plates which are assembled to one another in a box-like shape;
    at least one projection formed on an outer face of said rear plate;
    at least one stopper projection formed on an outer face of each side plate;
    a rear face holding piece extending from a rear edge of at least one of said top plate and said bottom plate along said rear plate, the rear face holding piece being formed with a holding member at a lower end portion thereof, the holding member elastically abutting on the outer face of the rear plate after climbing over said projection; and
    side face holding pieces extending from side edges of at least one of said top plate and said bottom plate along each of said pair of side plates, at least one side face holding piece formed with a notched portion at a lower end portion thereof, the notched portion including:
       a guide groove for receiving the stopper projection having a slanted edge which defines a width thereof increasing toward a forward side, and
       an engagement groove extending forward from an end of at least one guide groove for engaging with the stopper projection,
    wherein at least one of the top plate and the bottom plate is moved forward by a pushing force of the stopper projection with respect to the slanted edge when the stopper projection is guided in the guide groove along the slanted edge;

wherein the rear face holding piece is elastically deformed outward in accordance with the forward movement of at least one of the top plate and the bottom plate; and wherein a reaction plate of the rear face holding piece deformed by the forward movement of at least one of the top plate and the bottom plate is released when the stopper projection is engaged with the engagement groove.

11. The shield case of claim 10 wherein said side face holding pieces are bent inwardly and form a holding projection on said lower end portion, wherein a distance between opposed holding projections on side face holding pieces located on a left and a right side of said top plate is narrower than a distance between said pair of side plates.

12. The shield case of claim 11 further comprising additional side face holding piece members extending downwardly from said top plate that are formed as strips where each strip is bent inwardly and form a holding projection on a lower end portion, wherein a distance between opposed holding projections on said additional side face holding pieces located on a left and a right side of said top plate is narrower than a distance between said pair of side plates.

13. The shield case of claim 10 wherein said side face holding pieces are elastically deformable in a direction of their thickness.

14. The shield case of claim 10 wherein said projection is hemispherical in shape.

15. The shield case as set forth in claim 10, wherein a width of the engagement groove is wider than a vertical width of the stopper projection, and a length of the engagement groove is shorter than a horizontal width of the stopper projection; and wherein a distance between a front end of the engagement groove and the rear face holding piece is smaller than a distance between a rear edge of the side plate and a front end of the stopper projection when the stopper projection is not engaged with the engagement groove.

16. The shield case as set forth in claim 10, wherein a front end of the engagement groove and the rear face holding piece are elastically brought into contact with a rear edge of the side plate and a front end of the stopper projection, respectively.

* * * * *